United States Patent [19]

Markuson et al.

[11] Patent Number: 4,767,280
[45] Date of Patent: Aug. 30, 1988

[54] COMPUTERIZED CONTROLLER WITH SERVICE DISPLAY PANEL FOR AN OIL WELL PUMPING MOTOR

[76] Inventors: Neil D. Markuson, P.O. Box 221, Williston, N. Dak. 58801; Tim A. Wiens, 7906 Double Creek Court, Springfield, Va. 22153

[21] Appl. No.: 89,533

[22] Filed: Aug. 26, 1987

[51] Int. Cl.⁴ .................. F04B 49/06; G08B 21/00
[52] U.S. Cl. .......................... 417/44; 417/63; 166/53; 166/66; 340/664; 340/648
[58] Field of Search ............ 417/12, 18, 20, 44, 417/45, 43, 53, 63, ; 166/53, 65.1, 66; 340/648, 664

[56] References Cited

U.S. PATENT DOCUMENTS

| | | | |
|---|---|---|---|
| 3,509,824 | 5/1970 | Schmidly, Jr. | 417/12 |
| 3,610,779 | 10/1971 | Hubby | 417/63 X |
| 3,629,859 | 12/1971 | Copland et al. | 364/502 X |
| 3,931,559 | 1/1976 | McKee | 318/455 |
| 3,953,777 | 4/1976 | McKee | 417/45 X |
| 4,076,458 | 2/1978 | Jones | 417/63 X |
| 4,102,394 | 7/1978 | Botts | 417/45 X |
| 4,145,161 | 3/1979 | Skinner | 417/45 X |
| 4,307,395 | 12/1981 | Standish | 417/53 X |
| 4,473,338 | 9/1984 | Garmong | 417/63 X |
| 4,509,901 | 4/1985 | McTamaney et al. | 417/63 X |
| 4,633,954 | 1/1987 | Dixon et al. | 166/53 X |

Primary Examiner—Carlton R. Croyle
Assistant Examiner—Paul F. Neils

[57] ABSTRACT

An apparatus for controlling and monitoring an electrical motor used to pump petroleum from beneath the surface of the earth. A computerized metering apparatus is used to monitor overload power, underload power, as well as other conditions. When the demand power consumption of the electric motor exceeds or falls below preprogrammed limits, the computer provides an indication of the detected condition. A display panel with a particular combination of display lights is thus controlled by the computer to provide oil well service personnel with an indication of a detected problem, even from a distance. This allows service personnel to monitor the condition of a well without getting out of their service vehicle. Additionally, capability is provided to respond to signals provided from the company supplying electric power in order to control the pumping unit.

4 Claims, 2 Drawing Sheets

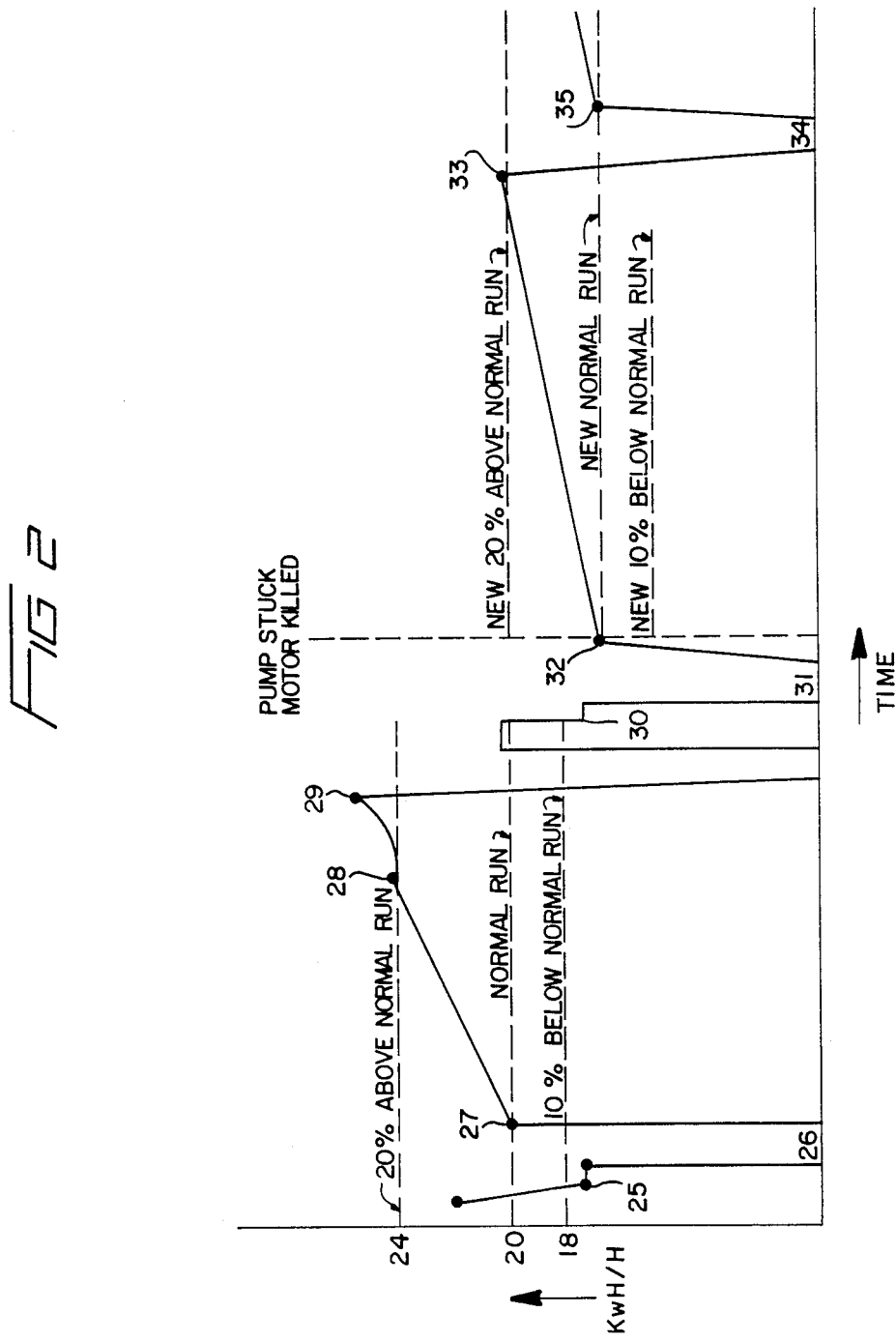

COMPUTERIZED CONTROLLER WITH SERVICE DISPLAY PANEL FOR AN OIL WELL PUMPING MOTOR

BACKGROUND OF THE INVENTION

The invention relates to power monitoring systems and more particularly to a system for monitoring and controlling an oil well pumping unit, by measuring the actual and demand power consumption.

The monitoring of the amount of electrical power consumed by an oil well pumping unit provides a useful method of determining how well the system is operating. Providing accurate power consumption information of an oil well to service personnel will not only allow them to more quickly determine when a problem has occurred, but it may also provide invaluable insight into a trend which may indicate the occurrence of an impending problem or the need for immediate servicing of the well. Additionally, close monitoring of power usage prevents excessive power consumption, since such a condition would quickly be detected and the problem corrected.

Many factors affect power consumption of an oil well pumping unit. One such factor which adversely affects power consumption is a buildup of paraffin wax. Paraffin wax is a translucent, odorless solid consisting of a mixture of high molecular weight hydrocarbons, and is present in a large number of oil fields in the United States and other countries. Although it is a useful by-product of oil recovery, and is used for such purposes as water proofing paper cartons, and is utilized in producing drugs and candles, etc., it also tends to interfere with the natural lubricating properties of oil. Correspondingly, an excess buildup of paraffin within a producing oil well tends to impede the pumping process, and causes the pumping motor to work harder than normal and therefore causing it to consume an excessive amount of electrical power. Additionally, this added stress may cause one or more portions of the pumping mechanism to fail or break.

Oil producing wells are often located in extremely remote areas and are widely spaced from each other. Correspondingly, oil well service personnel are rarely on hand to witness a malfunction or change in the operating parameters until long after it has occurred. This may result in excessive power consumption until the problem is detected, or even worse, may result in serious damage to the electric pump motor and the pumping unit. Additionally, oil well service personnel often must rely on experience with adjacent wells or an actual failure of a well pump in order to determine when servicing is required or a malfunction has occurred.

In addition to monitoring power consumption, the present invention is configured to be readily connected to the computer controlled demand limit control system of a power company. Such systems, which are still in the experimental stages in most parts of the country, allow a power company to more accurately control the total load on its power network.

DISCUSSION OF THE PRIOR ART

One controller used in an oil well related application is described in U.S. Pat. No. 3,931,559 to McKee. Mckee discloses a pump-off control circuit which monitors the current consumption of the electric motor driving the pumping unit. When it determines that a malfunction has occurred, the controller either shuts down the motor or provides an indication that a malfunction has occurred.

Several other controllers have been proposed which monitor the operation of an oil well. U.S. Pat. No. 4,473,338 to Garmong describes a computer controlled well pump. The Garmong invention includes a power transducer which provides an indication of the power consumption of pump motor 3, to a signal processor shown in FIG. 4. If power exceeds certain limits set by potentiometers 48 and 50, pump motor 3 is shut down by CPU 20 via solenoid 29. Garmong also discloses an additional computer 64 and printer/terminal 65 for on site analysis of system data.

U.S. Pat. No. 4,145,161 to Skinner, discloses an oil well pump speed control apparatus. In this invention, real power consumption of electric motor 16 is measured by power sensing means 20. Additionally, the rotational speed of motor 16 is measured by speed sensing means 24. Controller 22 then controls the speed of motor 16 in response to the power and speed data from 20 and 24 in order to maintain the speed generally proportional to the real power consumed by the pump. This allows oil to be pumped from an oil well at approximately the same rate as it flows into the well from the surrounding oil formation.

U.S. Pat. No. 3,629,859 Copland et al discloses a device for monitoring and controlling remotely located oil wells from a central station via telephone lines. The transmission of various well production data to a central computer, as well as control signals from the central computer to remote wells is disclosed.

U.S. Pat. No. 4,633,954 to Dixon et al, discloses a well production controller which measures well parameters and controls the intermittent injection of gas into wells to provide for optimum gas/liquid ratio and optimum production rates from the well. Additionally, Dixon et al discloses a microprocessor, digital display, keyboard, and various other typical computer related components.

None of the above discussed prior art devices disclose or render obvious, the novel features of the present invention. The monitoring of power consumption of an oil well is prior art, as was discussed above, but the capability of preprogramming the memory of an oil well controller with the desired upper and lower power parameters has not been shown. The Garmog device instead utilizes potentiometers to set these parameters. Additionally, it would be useful to provide a way to signal oil well service personnel that power consumption is above or below preprogrammed limits, as well as a visual numerical indication of actual real time power consumption, and the actual time that such a condition has occurred. If such information were available in readily readable form on one display panel, it would allow service personnel to more easily troubleshoot the existing problem. Such data would also allow service personnel to more accurately schedule servicing of the well in order to remove paraffin wax buildup or other discrepancies.

Garmong discloses the monitoring of power, but the actual power consumption values, total time that an underload or overload time has been occuring etc., are not displayed on a single display panel, as in the present invention. Instead a seperate computer 64 must be used to analyze power data etc. Similarly, McKee also discloses the monitoring of power and the lighting of a light, when controller 10 has gained control of the motor 12.

Moreover, it would be very desirable to provide a reprogrammable oil well controller which would be responsive to the requirements of a power company in implementing a computer controlled demand limit control system. None of the prior art addresses the incorporation of their systems into such demand limit control systems of a power company.

SUMMARY OF THE INVENTION

Therefore it is an object of the present invention to provide a readily discernable visual indication to service personnel when preprogrammed power limits have been passed. By closely monitoring power consumption of a pumping oil well, needless servicing may be eliminated. For example, previously an excess buildup of paraffin wax was difficult to detect and correspondingly, servicing of the well to remove the buildup was often done more than necessary in order to ensure that it did not adversely affect well pumping performance. The ability to detect paraffin wax buildup by watching power consumption therefore significantly reduces production costs since less servicing is required. The money saved may then be used in future energy development of crude oil fields.

An additional object is to provide digital display of actual real-time power consumption as well as how long the oil well has been surpassing the preprogrammed power limits. This data would be used to determine when servicing of a well is required in order to remove paraffin wax or to correct other problems.

It is also an object of this invention to provide a novel and computerized control system for oil well pumps for monitoring numerous system parameters, indicating when servicing is required, and/or automatically controlling the pumping unit directly.

Another object of the present invention is to periodically store detected system parameters such as power consumption, temperature, oil flow rate etc. for later retrieval. This archived data provides considerable information which may later be utilized by an engineer to determine why a particular malfunction occurred, or how to adjust the system so that it will operate more efficiently.

Yet another aspect of the invention is to provide remote control and monitoring of oil well operation. By utilizing a telephone line, an operator may monitor and control the well from extremely long distances. Additionally, if a number of wells are similarily accessible, a considerable amount of useful data may be collected at one location and certain trends and characteristics may be readily determined.

One further aspect of the present invention is to provide a remoteley programmable computerized oil well controller which is capable of responding to signals from a computer controlled demand limit control system located at a power company.

BRIEF DESCRIPTION OF THE DRAWINGS

FIG. 2 shows the real-time power operating characteristics of a typical well in operation, which are monitored by the controller of the present invention.

DESCRIPTION OF THE PREFERRED EMBODIMENT

Figure 1:
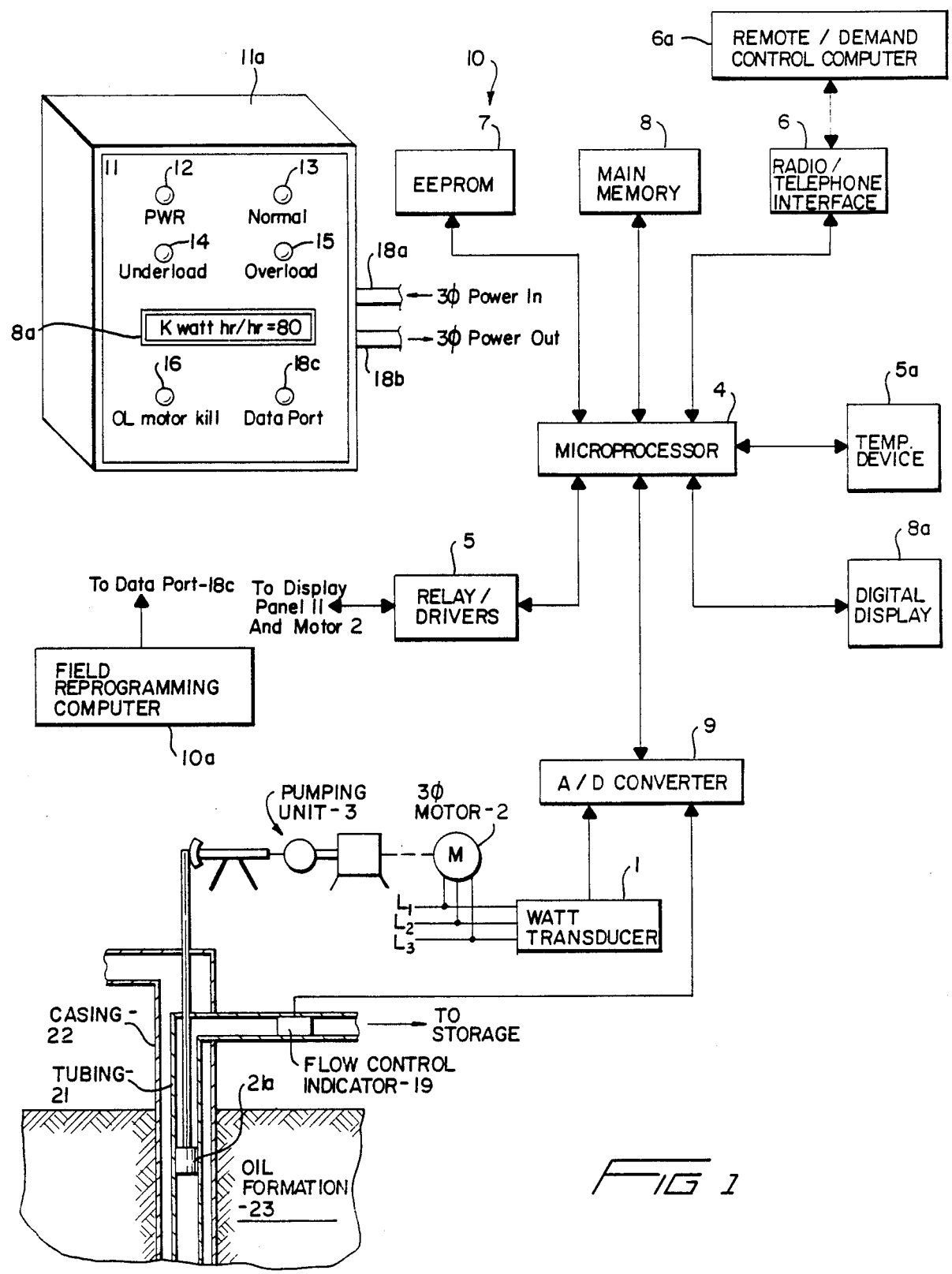
FIG. 1 is a view of a typical well installation with the various components of the controller of the present invention.

In order to detect an increase in paraffin wax buildup or other problems, the invention 10 shown in FIG. 1 monitors the power consumption of the pumping unit motor 2.

The controller 10 shown in FIG. 1 measures power consumption by utilizing a watt transducer 1. The output of watt transducer 1 is a 0-10 volt analog signal, representative of the real-time watt consumption of the electric motor 2. In order to use this information to calculate actual power useage in Kwatthours, the output 1a from watt transducer 1 is first routed to an A/D converter 9. Thus, A/D converter 9 produces a digital signal indicative of the power consumption to microprocessor 4. In the event of power failure, controller 10 contains an emergency battery supply. This allows all pertinent data to be retained until power is reapplied, therefore allowing the controller to continue processing without losing pertinent power consumption and other data. Microprocessor 4 utilizes this digital input to calculate actual power consumption, and correspondingly activates various overload, underload and other lights etc. which will be further described herein below. Microprocessor 4 may be easily calibrated, on a periodic basis, by merely modifying power calculation data in EEPROM memory 7. This calibration may be performed from remote distances via communication device 6, or a field reprogramming computer 10a.

Mounted on the front cover of the waterproof box 18 which contains controller 10, is a service display panel 11. This panel contains the various lights, access ports and controls required by the invention. Since all of the indicator lights 12-16 operate on 115 Volts AC, a relay/driver device 5 is required to allow digital microprocessor 4 to switch these lights on or off as required, and to control motor 2. Light 12 is turned on whenever power is applied to motor 2 and normal light 13 remains on when power is on and as long as microprocessor 4 determines that all conditions are normal. Overload light 15 is switched on by microprocessor 4 when it determines that a preprogrammed upper power limit has been exceeded. Underload light 14, similarly is switched on when power drops below a preprogrammed light. To facilitate easy recognition of detected problems, perhaps even without requiring service personnel to get out of their service vehicle, the various above lights are arranged on display panel 11 in a readily discernable pattern, as seen in FIG. 1. Typically, the top two lights, which represent the power on and normal run lights (lights 12 and 13 respectively), are green. Underload light 14 is yellow, overload light 15 is red, and motor kill light 16 is red. Thus, upon seeing two green lights, side by side, service personnel would know, even from a distance, that the well was running normally. Any other condition would cause them to take further notice and upon inspection they would note that either the overload light 15 or underlight 14 was on. Additionally, alphanumeric display 8a would display the actual time that the detected condition has been occuring, as well as the real-time power consumption of the motor 2. Main memory 8 contains the operating system software and a RAM memory for use by microprocessor 4. Digital display device 8a allows various sytem data such as real-time demand power consumption, cumulative power consumption, time, temperature, total overload time, total overload time, oil flow rate etc. to be displayed.

When microprocessor 4 measures a significant increase of power consumption, an overload light 15 is switched on, and a software timer located in the software of microprocessor 4 is started. The timer keeps track of how long an overload condition has occurred. Such information is useful for subsequent troubleshooting etc. Similarly, device 10 can detect an underload condition, thus turning on underload light and starting a similar underload timer.

FIG. 2 shows the power consumption curve of an average well, showing normal, 20% above normal and 10% below normal lines. When the 20% above normal line is crossed, an overload is detected. Similarly, when the 10% below normal line is crossed, an underload is detected.

Typically, an increase of demand power consumption of 20% indicates that the well contains an excessive amount of paraffin wax buildup, although this may vary from well to well. The increase in power consumption due to paraffin wax buildup is shown in FIG. 2 beween locations 27 and 28, as well as 32 and 33. Note the gradual rise of the power curve as paraffin increases. Prior to the present invention, little was known as to how often the well should be serviced to remove the excess paraffin. Quite often, service intervals were determined by comparison to adjacent wells or when excessive loading of the motor was extremely evident. Thus, a considerable amount of excessive electrical power was consumed.

At location 28 and 33 the 20% power consumption line is crossed, invention 10 determines that a 20% increase in power usage has occurred and overload indicator light 15 is switched on. At this time, oil well servicing personnel may readily determine that servicing may be required by seeing the overload light lit. To reduce the buildup of paraffin, a Hot Oil servicing truck is moved to the well to pump hot oil down the casing 22. The pump in the oil formation 23, picks up this hot oil and the paraffin is melted as it comes up the tubing string 21. This then melts the wax buildup, and the power consumption curve should return to its normal operation value as is seen at position 35 of FIG. 2.

Note that the treament of an oil well with hot oil to reduce paraffin buildup does not always reduce power consumption if other problems occur. At location 28 of FIG. 2, an overload was detected and the subsequently hot oiled. However, power consumption can be seen to continue upward until position 29 where the pump stuck and the motor killed. Normally, service personnel would notice that the overload light 15 was continually lit between locations 28 and 29. Additionally, a digital display 8a, which provides a continuous output of system parameter data including KWHour consumption, would indicate that power consumption was steadily increasing. Thus, the well should be shut down to determine the reason for the continued power increase.

FIG. 2 also shows how the detection of an underload power consumption condition which may indicate that other problems are occuring. An underload condition may indicate slow oil seepage from the oil formation into the well tubing 21. Thus, the oil is being pumped from faster then oil can seep into it from the oil formation 23. Correspondingly, an excessive amount of electrical energy is expended. Upon detection of this underload condition by controller 10, the pumping motor 2 may be slowed to to achieve a more even balance of oil seepage in and oil being pumped out. This not only prevents unnecessary expenditure of electrical power, but also minimizes wear and tear on the pumping unit 3 and motor 2, as well as the other associated machinery. Alternatively, reduced power consumption may be caused by a hole in well tubing 21. Location 26 of FIG. 2 shows when the oil well tubing was replaced, and position 27 shows that power consumption appears normal again. Many other problems can similarly be detected by noting when power consumption dips. Position 30 shows the detection of an underload condition which is corrected in position 31 by reducing the amount of iron sulfide in the pump. Upon detection of an underload condition, microprocessor 4 would cause underload light 14 to light.

At position 32 of FIG. 2, the pump is restarted at a slower speed. Hence the normal, and 20% above and 10% below lines are readjusted. The particular normal, above normal, and below normal power values to be monitored, may be different for each well. Thus, these values which are typically determined upon initial startup of a well are stored in a data memory EEPROM 7. As the controller monitors power consumption, it continually compares the computed power value to the normal, overload and underload values in EEPROM 7.

A seperate programming device 10a, which may consist of a laptop/portable computer is used to store the overload, normal, and under load values as well as other required data in EEPROM 7 via port 18c on display panel 11. Additionally, field programmer 10a may be used to download stored historical data concerning past operating parameters of the system, which have been stored in EEPROM 7 by microprocessor 4, as well as to perform programming changes in the field. Computer 10a would contain a disk storage system, monitor and a printer.

In addition to measuring power, device 10 may measure such conditions as temperature (via temperature device 5a), oil flow from the well (via flow rate indicator 19), as well as other parameters which would be useful to monitor.

Controller 10 may be interconnected with a telephone line as shown by radio-telephone interface device 6, in order to allow it to download operating data to a remote computer 6a. Thus an operator can continually monitor a well from extremely long distances. This capability of collecting real-time data on one or a number of wells at one location, is extremely useful in detecting certain trends and provides a central point for direction of oil well servicing operations. Additionally, such data as oil flow rate can be monitored to keep track of the quantity of oil that a well is producing. This data may be useful in determining whether a well should be shut down when the measured electrical power cost is greater than the value of the amount of oil being produced. Thus, wells may be switched on or off depending on its present oil production rate, electrical consumption and the present value of crude oil.

An additional feature of oil well controller 10 is the capability of controlling the the pumping unit motor 2. Thus, upon detection of various predetermined conditions, the motor 2 may be slowed down, shut down or restarted as desired. Such control of the well may also be accomplished via the telephone connection circuitry 6. This would allow a distant operator to control the operation of the well as desired. Additionally, a similar connection to a power company (via telephone line or other connection) would allow a power company to provide power or remove power as necessary. A number of power companies are installing computer controlled systems known as demand limit control (see remote/demand limit control computer 6a), which provides computer control of the total load on a power distribution system.

In such a demand limit control system, the power company would send a shut down signal from demand limit control computer 6a to the oil well controller 10. If microprocessor 4 determines that a preprogrammed run time has occurred, the controller would shut down the motor 2. Upon shutdown, EEPROM 7 stores all pertinent data necessary for restart later on. Alternatively, main memory 8 may consist of a battery-backed RAM to similarly store necessary data. If microprocessor 4 determines that motor 2 has not been operating for the preprogrammed period of time, it will allow the motor 2 to continue to run until such time has transpired. Upon receiving a restart signal from the power company, microprocessor determines how long the pumping motor 2 has been shut off, and calculates how long the motor should be run to makeup the lost time. For example, if an oil well is running on a time clock of 20 hours a day (i.e. it runs for an hour, then is shut down for 15 minutes) and EEPROM 7 has data stored to allow motor 2 to be shut down only if it has run for at least 5 of the last 8 hours. If a signal to shutdown is received from the power company, and motor 2 has indeed run for at least 5 hours, controller shuts motor 2 down. If the power company keeps it off for three hours, then turns it back on, controller 10 bypasses the normal 1 hour on 15 minutes off sequence, and instead allows motor 2 to run for 3 hours continuously before resuming the normal sequence. This will allow the oil-well pumping unit to pick up lost time. Relay/driver device 5, contains the necessary relays to provide or remove power to/from motor 2, in response to control from microprocessor 4. Three phase power for the pumping motor is first routed to controller 10 via conduit 18a. Correspondingly, power is provided to or removed from motor 2 via conduit 18b, in response to control signals from microprocessor 4 to the appropriate relay in relay/driver device 5.

The present invention, therefore, is well adapted to monitor and control an oil well pumping motor and carry out the objects and provide the advantagaes mentioned as well as others which would be obvious to one skilled in the art. Although a preferred embodiment of the invention has been detailed for the purpose of disclosure, numerous changes or arrangement of components may be made without departing from the spirit of the invention and the scope of the appended claims.

What is claimed is:

1. An oil well pump controller in combination with an oil pumping unit and oil well electrical pump motor for controlling and monitoring the operation of an oil well comprising,
   microprocessor means for monitoring three-phase electrical power consumption of the electrical pump motor and for calculating real time demand power consumption of said motor,
   power measuring means electrically connected to the three-phase electrical input of said motor for producing an analog signal indicative of power consumption,
   conversion means connected to said power measuring means for converting said analog signal into a digital signal usable by said microprocessor means to calculate electrical power consumption,
   relay means connected to and receiving signals from said microprocessor means indicative of detected power normal, power overload and power underload conditions, said relay means additionally providing circuitry to allow said microprocessor to selectively switch said motor on or off,
   waterproof box means for housing the components of said oil well pump controller, said waterproof box including a service display panel,
   overload display means, mounted on said service display panel, which is clearly visible from a distance, and connected to said relay means for indicating when power consumption of said motor has exceeded preprogrammed limits.
   underload display means, mounted on said service display panel, which is clearly visible from a distance, and connected to said relay means for indicating when power consumption is below preprogrammed limits,
   memory means connected to said microprocessor means for storing said preprogrammed limits and other data for use by said microprocessor means to allow it to determine when the power consumption has exceeded or is below said preprogrammed limits,
   reprogramming means which may be selectively connected to said microprocessor means, for entering said data and said preprogrammed limits into said memory means via a reprogramming data port mounted on said service dispaly panel, and for downloading system parameter data which has been stored in said memory by said microprocessor,
   alphanumeric display means, mounted on said service display panel, and connected to said microprocessor means for visually displaying various system parameter information including oil flow, temperature data, normal, overload, and underload real time demand power values, as well as displaying the total time that said motor has been in an said underload or overload condition, thus allowing service personnel at the well to more accurately determine when servicing of the well is required, said alphanumeric display means displaying said system parameter information in response to signals from said microprocessor,
   remote communication means connected to said microprocessor, for allowing said microprocessor to communicate with a remotely located central computer which may consist of a demand limit power control system to allow a power company to more efficiently utilize its energy resources, and to cause said microprocessor to switch said motor on or off via said relay means, as required.

2. The combination of claim 1, wherein said remote communication means allows said microprocessor to download said stored system parameter data to said remotely located central computer and to be reprogrammed by said remotely located central computer, said microprocessor being configured to download said stored system parameter data and to be reprogrammed by said reprogramming means which consists of an on site field reprogramming computer.

3. The combination of claim 2, wherein said field reprogramming computer consists sof a laptop computer which contains a disk storage system, keyboard, monitor and printer and allows system parameter data stored in said memory means to be downloaded into said disk storage system and output onto said printer to enable analysis of system operation.

4. The combination of claim 1, wherein said underload display means and said overload display means are located on said service display panel with said alphanumeric display means, along with a power on display means and a normal run display means, in a particular pattern which allows ready determination that a problem has been detected.

* * * * *